United States Patent
Hashiguchi

(10) Patent No.: US 10,483,668 B2
(45) Date of Patent: Nov. 19, 2019

(54) CONNECTOR AND CIRCUIT BOARD ASSEMBLY

(71) Applicant: Japan Aviation Electronics Industry, Limited, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/975,174

(22) Filed: May 9, 2018

(65) Prior Publication Data

US 2019/0027846 A1 Jan. 24, 2019

(30) Foreign Application Priority Data

Jul. 24, 2017 (JP) ................................ 2017-142455

(51) Int. Cl.
*H01R 12/71* (2011.01)
*H05K 1/02* (2006.01)
(Continued)

(52) U.S. Cl.
CPC ......... *H01R 12/712* (2013.01); *H01R 12/613* (2013.01); *H01R 12/69* (2013.01); *H01R 12/78* (2013.01); *H05K 1/0277* (2013.01); *H05K 1/147* (2013.01); *H05K 3/365* (2013.01); *H05K 3/326* (2013.01); *H05K 2201/10446* (2013.01);
(Continued)

(58) Field of Classification Search
CPC ...... H01R 12/00; H01R 12/722; H01R 12/78; H01R 12/91; H01R 12/712; H01R 12/613; H01R 12/69; H05K 1/0277; H05K 1/147; H05K 3/326; H05K 3/361; H05K 1/0278; H05K 1/028; H05K 1/0281; H05K 3/365;
(Continued)

(56) References Cited

U.S. PATENT DOCUMENTS 4,784,615 A * 11/1988 Teng-Hong ............ H01R 12/61
439/496
5,885,091 A * 3/1999 Belanger, Jr. .......... H05K 3/326
439/67
(Continued)

FOREIGN PATENT DOCUMENTS

| EP | 2913897 A1 | 9/2015 |
| JP | 472789 | 3/1992 |
| JP | 2005-122901 A | 12/2005 |

*Primary Examiner* — Travis S Chambers
(74) *Attorney, Agent, or Firm* — Muncy, Geissler, Olds & Lowe, P.C.

(57) ABSTRACT

A connector includes a first connector portion in which projections project from a surface of a base plate, and a second connector portion formed of a fitting plate in which fitting holes corresponding to the projections are formed, at least either the projections or the fitting holes having elasticity, when the projections of the first connector portion are fitted in the fitting holes of the second connector portion as catching the first contact portion and the second contact portion with the first and second contact portions facing and being overlapped on each other, the first contact portion and the second contact portion being elastically pressed against each other and contacted to each other to establish electrical connection therebetween in a space between a lateral surface of the projections and an inner surface of the fitting holes.

16 Claims, 16 Drawing Sheets

(51) Int. Cl.
  *H01R 12/61* (2011.01)
  *H01R 12/69* (2011.01)
  *H01R 12/78* (2011.01)
  *H05K 1/14* (2006.01)
  *H05K 3/36* (2006.01)
  *H05K 3/32* (2006.01)

(52) U.S. Cl.
  CPC .............. *H05K 2201/10598* (2013.01); *H05K 2203/167* (2013.01)

(58) Field of Classification Search
  CPC ... H05K 2203/167; H05K 2201/10598; H05K 2201/10446
  USPC .................................. 439/65, 66, 67, 74, 374
  See application file for complete search history.

(56) References Cited

U.S. PATENT DOCUMENTS

| | | | |
|---|---|---|---|
| 6,447,305 B1* | 9/2002 | Roberts | H01R 12/774 439/260 |
| 7,063,561 B2* | 6/2006 | Pabst | H01R 12/61 439/495 |
| 2007/0224878 A1 | 9/2007 | Kao | |
| 2011/0212631 A1* | 9/2011 | Iida | H01R 12/52 439/74 |
| 2015/0180148 A1* | 6/2015 | Hashiguchi | H01R 12/716 439/74 |
| 2015/0188256 A1 | 7/2015 | Hashiguchi | |

\* cited by examiner

CONNECTOR AND CIRCUIT BOARD ASSEMBLY

BACKGROUND OF THE INVENTION

The present invention relates to a connector, particularly to a connector for connecting a first circuit board having a bendable first contact portion and a second circuit board having a bendable second contact portion.

The present invention also relates to a circuit board assembly in which the first circuit board and the second circuit board are connected by means of the connector.

A connector for connecting a flexible flat cable to a circuit board such as a flexible printed circuit (FPC) is disclosed by, for example, JP 2005-122901 A. As shown in FIG. 33, this connector is for connecting a plurality of circuit conductors 2 arranged at an FPC 1 and a plurality of flat conductors 4 in a flat cable 3 and is composed of a connector body 5 and a plate member 6 that face each other so as to sandwich an overlap part where the FPC 1 and the flat cable 3 overlap. As shown in FIG. 34, the connector body 5 has a plurality of metallic penetrating pieces 7, while the plate member 6 has a plurality of receiving grooves 8 formed therein.

With the connector body 5 and the plate member 6 being positioned with respect to the FPC 1 and the flat cable 3 such that the penetrating pieces 7 and the receiving grooves 8 separately correspond to the circuit conductors 2 of the FPC 1 and the flat conductors 4 of the flat cable 3, the penetrating pieces 7 of the connector body 5 are thrust into the overlap part where the FPC 1 and the flat cable 3 overlap, and accordingly, the circuit conductors 2 of the FPC 1 and the flat conductors 4 in the flat cable 3 are sheared by the penetrating pieces 7. Upon insertion of the penetrating pieces 7, sheared parts of the circuit conductors 2 and sheared parts of the flat conductors 4 come into contact with the metallic penetrating pieces 7. As a result, the circuit conductors 2 of the FPC 1 and the flat conductors 4 of the flat cable 3 are electrically connected via the penetrating pieces 7.

Meanwhile, the circuit conductors 2 are disposed on a base, made of an insulating material, of the FPC 1, and the flat conductors 4 are covered with an insulating material of the flat cable 3; therefore, when the penetrating pieces 7 are thrust into the overlap part where the FPC 1 and the flat cable 3 overlap, the base of the FPC 1 is also sheared along with the circuit conductors 2, and the insulating material of the flat cable 3 is also sheared along with the flat conductors 4. Consequently, a sheared piece of the insulating material may be caught between a penetrating piece 7 and a circuit conductor 2 and between a penetrating piece 7 and a flat conductor 4, resulting in a poor contact between the piercing part 7 and the circuit conductor 2 and between the piercing part 7 and the flat conductor 4. When such a poor contact occurs, the reliability of electrical connection between the circuit conductors 2 of the FPC 1 and the flat conductors 4 of the flat cable 3 decreases.

In addition, a great force is necessary to thrust the penetrating pieces 7 of the connector body 5 into the FPC 1 at which the circuit conductors 2 are disposed and the flat cable 3 having the flat conductors 4 therein. Accordingly, it is difficult to readily attach the connector body 5 and the plate member 6 to the FPC 1 and the flat cable 3.

SUMMARY OF THE INVENTION

The present invention has been made to overcome the conventional problems as above and aims at providing a connector that enables reliable and easy connection between two circuit boards.

The present invention also aims at providing a circuit board assembly in which two circuit boards are connected by means of the connector.

A connector according to the present invention is one for connecting a first circuit board having a first contact portion that is bendable and a second circuit board having a second contact portion that is bendable, the connector comprising:

a first connector portion in which one or more projections project from a surface of a base plate; and a second connector portion formed of a fitting plate in which one or more fitting holes corresponding to the one or more projections are formed, wherein at least either the one or more projections or the one or more fitting holes have elasticity, and wherein when the one or more projections of the first connector portion are fitted in the one or more fitting holes of the second connector portion as catching the first contact portion of the first circuit board and the second contact portion of the second circuit board with the first and second contact portions facing and being overlapped on each other, the first contact portion of the first circuit board and the second contact portion of the second circuit board are elastically pressed against each other and contacted to each other to establish electrical connection therebetween in a space between a lateral surface of the one or more projections and an inner surface of the one or more fitting holes.

A circuit board assembly according to the present invention comprises:

the first circuit board;

the second circuit board; and the connector, wherein the one or more projections of the first connector portion are fitted in the one or more fitting holes of the second connector portion as catching the first contact portion of the first circuit board and the second contact portion of the second circuit board with the first and second contact portions facing and being overlapped on each other, and the first contact portion of the first circuit board and the second contact portion of the second circuit board are elastically pressed against each other and contacted to each other to establish electrical connection therebetween in a space between the lateral surface of the one or more projections and the inner surface of the one or more fitting holes.

DETAILED DESCRIPTION OF THE INVENTION

Embodiments of the present invention are described below based on the appended drawings.

Embodiment 1

Figure 1:
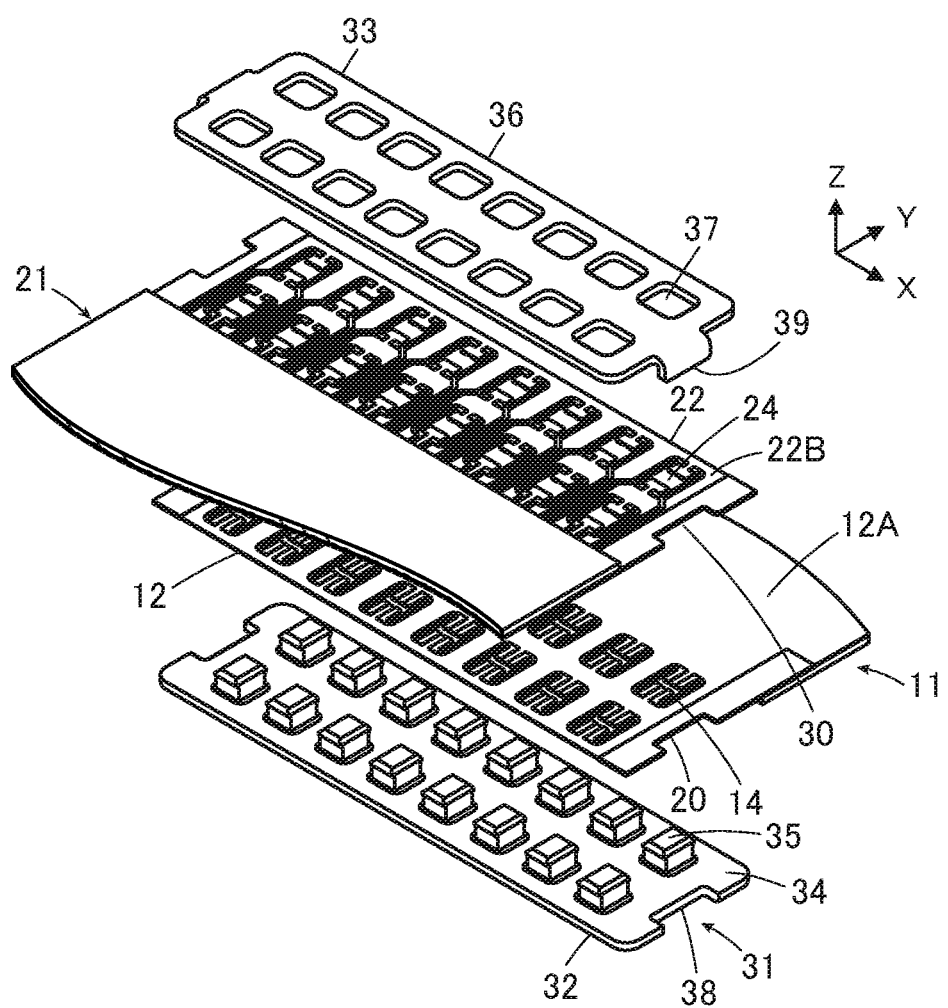
FIG. 1 is a perspective view of a first connector portion, a first circuit board, a second circuit board and a second connector portion of a circuit board assembly according to Embodiment 1 of the present invention before assembling, as seen obliquely from above.
Figure 2:
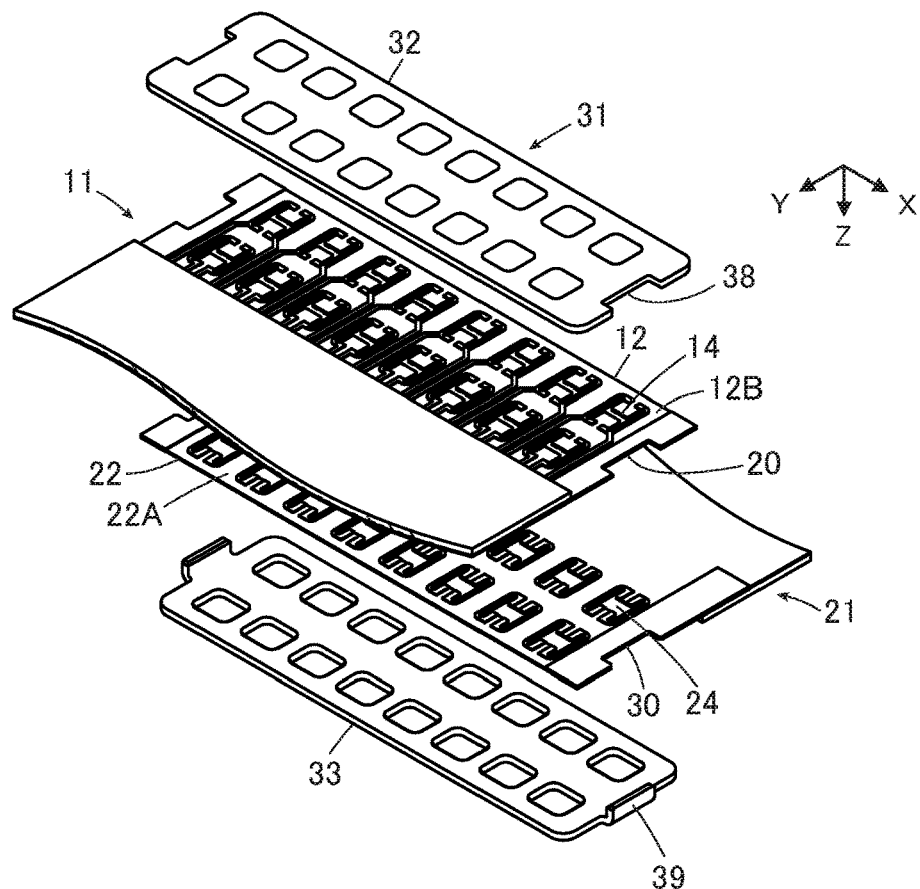
FIG. 2 is a perspective view of the first connector portion, the first circuit board, the second circuit board and the second connector portion of the circuit board assembly according to Embodiment 1 before assembling, as seen obliquely from below.

FIGS. 1 and 2 show a first circuit board 11, a second circuit board 21 and a connector 31 which are used in a circuit board assembly according to Embodiment 1, before assembling. The connector 31 is composed of a first connector portion 32 and a second connector portion 33 that are detachable to each other. The first circuit board 11, the second circuit board 21, the first connector portion 32 and the second connector portion 33 are each a flat plate member and are arranged parallel to each other. The first circuit board 11 and the second circuit board 21 are sequentially arranged between the first connector portion 32 and the second connector portion 33.

For convenience, the first circuit board 11, the second circuit board 21, the first connector portion 32 and the second connector portion 33 are defined as extending along an XY plane, and the direction from the first connector portion 32 to the second connector portion 33 is referred to as "+Z direction."

The first circuit board 11 includes a flexible first substrate 12 having insulation properties and a plurality of H-shaped openings 14 penetrating from a top surface 12A of the first substrate 12 to a bottom surface 12B thereof. The openings 14 are arranged in eight rows in the X direction which is the width direction of the first circuit board 11 and in two rows in the Y direction which is the length direction of the first circuit board 11. Thus, 16 openings 14 are formed in total.

Figure 3:
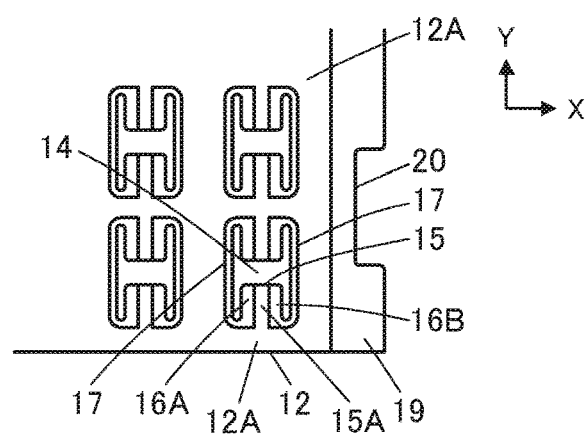
FIG. 3 is a view showing a top surface of the first circuit board in Embodiment 1.
Figure 4:
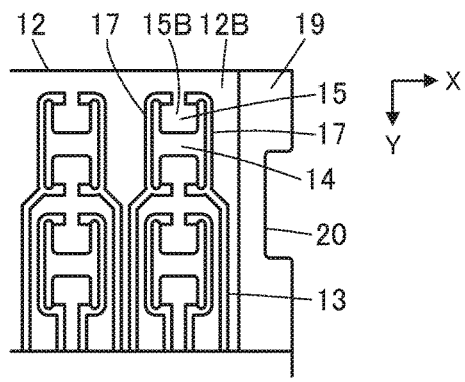
FIG. 4 is a view showing a bottom surface of the first circuit board in Embodiment 1.

As shown in FIGS. 3 and 4, each opening 14 is provided with a pair of first protruding pieces 15 that are formed of part of the flexible first substrate 12 and protrude to face each other in the Y direction in the associated opening 14. As shown in FIG. 3, on the top surfaces 15A, facing in the +Z direction, of the pair of first protruding pieces 15 in the top surface 12A of the first substrate 12, a pair of conductive first contact portions 16A are formed at the −X directional ends of the first protruding pieces 15, while a pair of conductive first contact portions 16B are formed at the +X directional ends thereof. The pair of first contact portions 16A are electrically interconnected by a conductive portion 17 formed at the −X direction-side edge of the opening 14, while the pair of first contact portions 16B are electrically interconnected by a conductive portion 17 formed at the +X direction-side edge of the opening 14. Part of the first substrate 12 having insulation properties is exposed at the bottom surfaces 15B of the first protruding pieces 15 facing in the −Z direction.

As shown in FIG. 4, the bottom surface 12B of the first substrate 12 is provided with a first wiring portion 13 formed of a conductive layer, and conductive portions 17 formed at the −X and +X direction-side edges of each opening 14 are separately connected to different wires of the first wiring portion 13.

Figure 5:
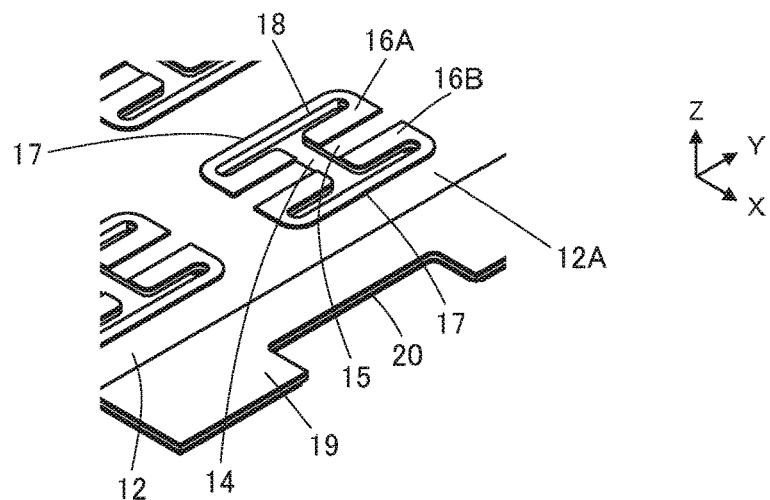
FIG. 5 is a perspective view showing a first contact portion of the first circuit board in Embodiment 1.

The conductive portion 17 formed on the top surface 12A of the first substrate 12 at the −X direction-side edge of the opening 14 and the conductive portion 17 formed on the bottom surface 12B of the first substrate 12 at the −X direction-side edge of the opening 14 are electrically interconnected via a conductive layer 18 formed on an end surface (YZ plane) at the −X direction-side edge of the opening 14, as shown in FIG. 5. Likewise, the conductive portion 17 formed on the top surface 12A of the first substrate 12 at the +X direction-side edge of the opening 14 and the conductive portion 17 formed on the bottom surface 12B of the first substrate 12 at the +X direction-side edge of the opening 14 are electrically interconnected via a conductive layer 18 formed on an end surface (YZ plane) at the +X direction-side edge of the opening 14.

Thus, the pair of first contact portions 16A and the pair of first contact portions 16B on the top surface 12A of the first substrate 12 are separately connected to different wires of the first wiring portion 13 on the bottom surface 12B of the first substrate 12 via the conductive portions 17 and the conductive layers 18. In other words, the first contact portions 16A are electrically insulated from the first contact portions 16B in the first circuit board 11.

The first circuit board 11 further includes reinforcement portions 19 separately formed at the −X and +X directional ends of the first substrate 12.

The first contact portions 16A and 16B, the conductive portions 17, the first wiring portion 13 and the reinforcement portions 19 can be formed by fabricating a conductive layer by patterning on each of the top surface 12A and the bottom surface 12B of the first substrate 12. That is, the reinforcement portions 19 are also made of conductive foil formed on the top surface 12A and the bottom surface 12B of the first substrate 12.

The first circuit board 11 further has a positioning cutout 20 of rectangular shape formed in each reinforcement portion 19.

The second circuit board 21 has the same structure as that of the first circuit board 11. Specifically, the second circuit board 21 includes a flexible second substrate 22 having insulation properties and a plurality of H-shaped openings 24 penetrating from a top surface 22A of the second substrate 22 to a bottom surface 22B thereof. The openings 24 are arranged in eight rows in the X direction which is the width direction of the second circuit board 21 and in two rows in the Y direction which is the length direction of the second circuit board 21. Thus, 16 openings 24 are formed in total.

However, the second circuit board 21 is disposed such that the top and bottom surfaces thereof face in the opposite directions from those of the first circuit board 11, and thus, the top surface 22A of the second substrate 22 of the second circuit board 21 is opposed to the top surface 12A of the first substrate 12 of the first circuit board 11.

Figure 6:
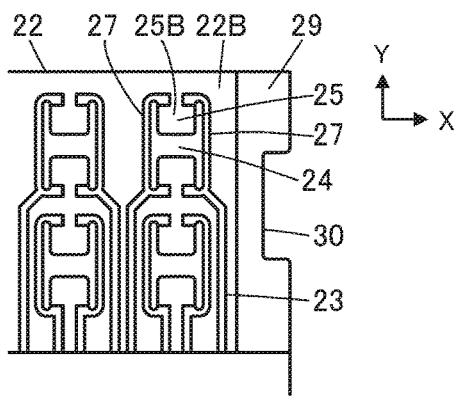
FIG. 6 is a view showing a bottom surface of the second circuit board in Embodiment 1.

As shown in FIG. 6, a pair of second protruding pieces 25 formed of part of the flexible second substrate 22 protrude in each opening 24, the bottom surface 22B of the second substrate 22 is provided with a second wiring portion 23 formed of a conductive layer, and conductive portions 27 formed at the −X and +X direction-side edges of the opening 24 are separately connected to different wires of the second wiring portion 23.

Figure 7:
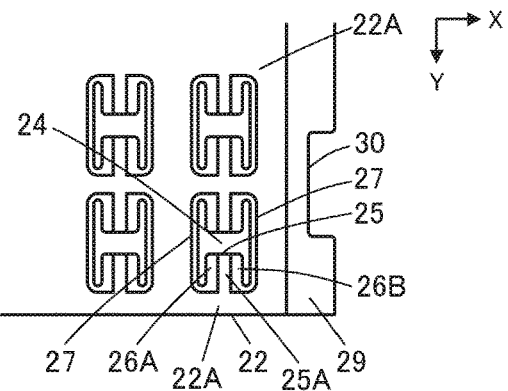
FIG. 7 is a view showing a top surface of the second circuit board in Embodiment 1.

As shown in FIG. 7, on the top surfaces 25A, facing in the −Z direction, of the pair of second protruding pieces 25 in the top surface 22A of the second substrate 22, a pair of conductive second contact portions 26A are formed at the −X directional ends of the second protruding pieces 25, while a pair of conductive second contact portions 26B are formed at the +X directional ends thereof. The pair of second contact portions 26A are electrically interconnected by a conductive portion 27 formed at the −X direction-side edge of the opening 24, while the pair of second contact portions 26B are electrically interconnected by a conductive portion 27 formed at the +X direction-side edge of the opening 24. Part of the second substrate 22 having insulation properties is exposed at the bottom surfaces 25B of the second protruding pieces 25 facing in the +Z direction.

Figure 8:
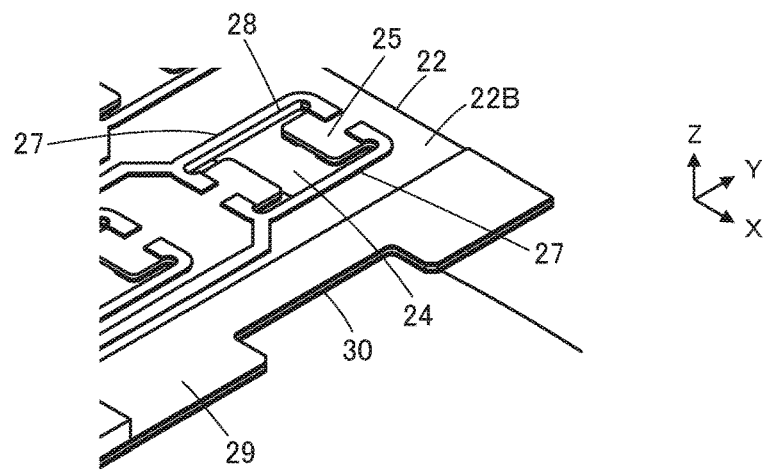
FIG. 8 is a perspective view showing a second contact portion of the second circuit board in Embodiment 1.

As shown in FIG. 8, the conductive portion 27 on the top surface 22A of the second substrate 22 and the corresponding conductive portion 27 on the bottom surface 22B of the second substrate 22 are electrically interconnected via a conductive layer 28 formed on an end surface (YZ plane) at the −X or +X direction-side edge of the opening 24.

Thus, the pair of second contact portions 26A and the pair of second contact portions 26B on the top surface 22A of the second substrate 22 are separately connected to different wires of the second wiring portion 23 on the bottom surface 22B of the second substrate 22 via the conductive portions 27 and the conductive layers 28. In other words, the second contact portions 26A are electrically insulated from the second contact portions 26B in the second circuit board 21.

The second circuit board 21 further includes reinforcement portions 29 separately formed at the −X and +X directional ends of the second substrate 22.

The second contact portions 26A and 26B, the conductive portions 27, the second wiring portion 23 and the reinforcement portions 29 can be formed by fabricating a conductive layer by patterning on each of the top surface 22A and the bottom surface 22B of the second substrate 22. That is, the reinforcement portions 29 are also made of conductive foil formed on the top surface 22A and the bottom surface 22B of the second substrate 22.

The second circuit board 21 has a positioning cutout 30 of rectangular shape formed in each reinforcement portion 29.

As shown in FIG. 1, the first connector portion 32 of the connector 31 includes a base plate 34 having insulation properties and a plurality of projections 35 projecting on the surface of the base plate 34 facing in the +Z direction, while the second connector portion 33 of the connector 31 includes a fitting plate 36 having insulation properties and a plurality of fitting holes 37 penetrating the fitting plate 36. The projections 35 of the first connector portion 32 and the fitting holes 37 of the second connector portion 33 correspond to the openings 14 of the first circuit board 11 and the openings 24 of the second circuit board 21. Accordingly, the projections 35 are arranged in eight rows in the X direction and in two rows in the Y direction, and thus, 16 projections 35 are formed in total. The same holds for the fitting holes 37.

Figure 9:
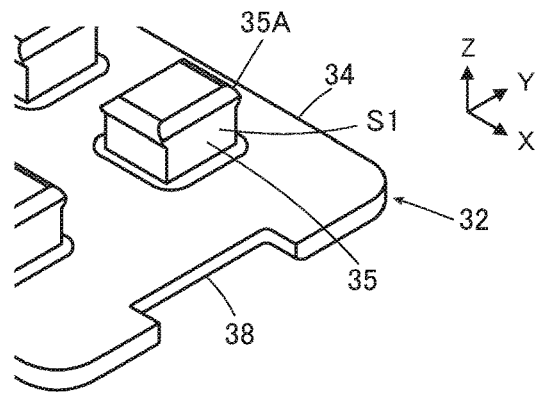
FIG. 9 is a perspective view showing a projection of the first connector portion in Embodiment 1.

As shown in FIG. 9, each projection 35 of the first connector portion 32 projects in the +Z direction from the surface of the base plate 34, has a shape of substantially rectangular column projecting in the +Z direction from the surface of the base plate 34, and has four lateral surfaces S1 extending along an XZ plane or a YZ plane. The projection 35 is made of an insulating material such as insulating rubber and has elasticity at least in the Y direction. The +Z directional end of the projection 35 is provided with overhanging portions 35A overhanging in the +Y and −Y directions.

The first connector portion 32 has positioning cutouts 38 of rectangular shape separately formed at the −X and +X directional ends of the base plate 34.

Figure 10:
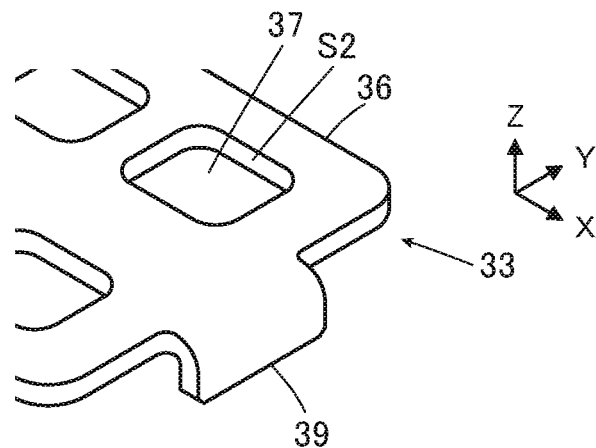
FIG. 10 is a perspective view showing a fitting hole of the second connector portion in Embodiment 1.

As shown in FIG. 10, each fitting hole 37 of the second connector portion 33 is in a substantially rectangular flat shape and has an inner surface S2 extending along the circumference of the fitting hole 37. The second connector portion 33 has positioning protrusions 39 separately formed at the −X and +X directional ends of the fitting plate 36 and protruding in the −Z direction.

The projection amount of the projection 35 from the surface of the base plate 34 in the first connector portion 32 is set to be larger than the sum of the plate thicknesses of the first circuit board 11, the second circuit board 21 and the fitting plate 36 of the second connector portion 33.

The projection 35 of the first connector portion 32 is fitted into the corresponding fitting hole 37 of the second connector portion 33 as catching the first contact portions 16A and 16B of the first circuit board 11 and the second contact portions 26A and 26B of the second circuit board 21, and when the projection 35 has been fitted in the fitting hole 37, the first contact portions 16A of the first circuit board 11 and the second contact portions 26A of the second circuit board 21 are sandwiched between the relevant lateral surface S1 of the projection 35 and the inner surface S2 of the fitting hole 37, and the same holds for the first contact portions 16B and the second contact portions 26B.

At this time, the bottom surfaces 15B of the pair of first protruding pieces 15, on which part of the first substrate 12 having insulation properties is exposed, come into contact with the relevant lateral surfaces S1 of the projection 35, while the bottom surfaces 25B of the pair of second protruding pieces 25, on which part of the second substrate 22 having insulation properties is exposed, come into contact with the inner surface S2 of the fitting hole 37, and the pair of first contact portions 16A formed on the top surfaces 15A of the pair of first protruding pieces 15 come into contact with the pair of second contact portions 26A formed on the top surfaces 25A of the pair of second protruding pieces 25. The projection 35 is defined as having a sufficient size in the Y direction that allows the first contact portions 16A and 16B of the first circuit board 11 and the second contact portions 26A and 26B of the second circuit board 21 to be elastically pressed against each other correspondingly to establish their contact and hence electrical connection in a space between the relevant lateral surfaces S1 of the projection 35 and the inner surface S2 of the fitting hole 37.

Figure 11:
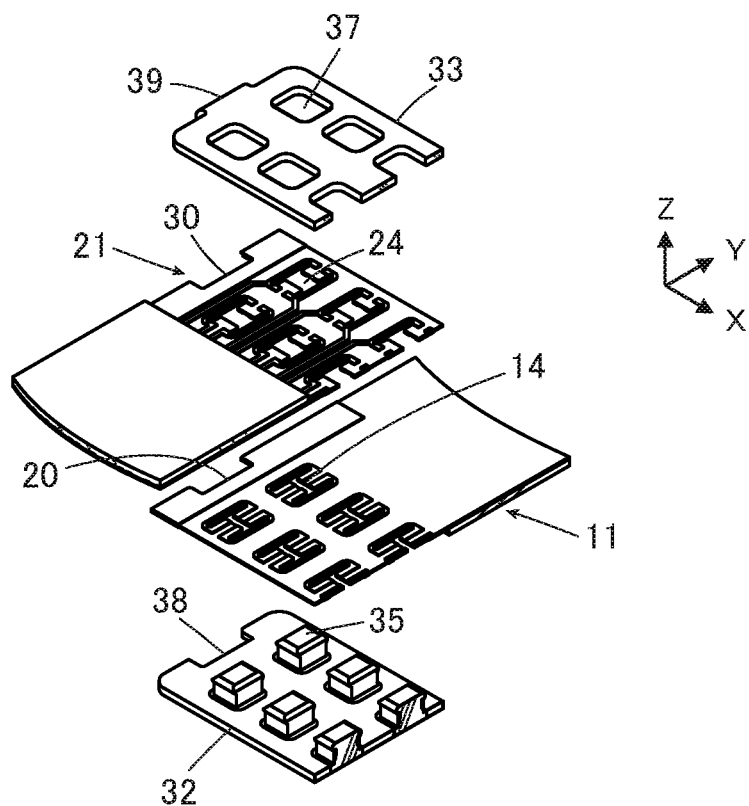
FIG. 11 is a cutaway perspective view of the first connector portion, the first circuit board, the second circuit board and the second connector portion of the circuit board assembly according to Embodiment 1 before assembling.
Figure 12:
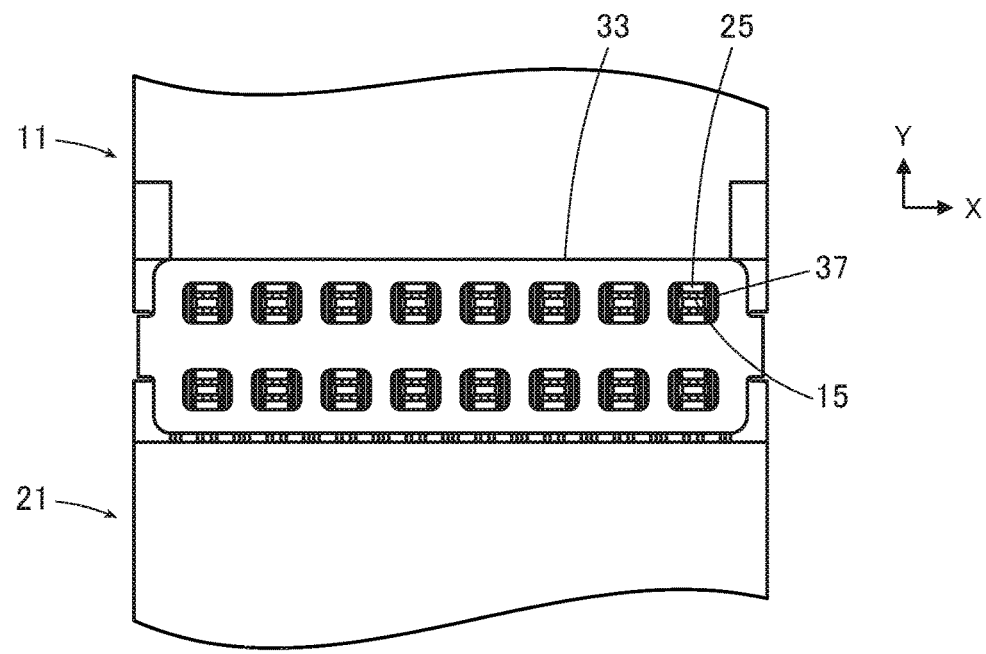
FIG. 12 is a plan view of the first connector portion, the first circuit board, the second circuit board and the second connector portion that are aligned in Embodiment 1, as seen from the top.

When the circuit board assembly is assembled using the first circuit board 11, the second circuit board 21 and the connector 31 as above, firstly, as shown in FIG. 11, the first connector portion 32, the first circuit board 11, the second circuit board 21 and the second connector portion 33 are positioned such that the projections 35 of the first connector portion 32, the openings 14 of the first circuit board 11, the openings 24 of the second circuit board 21 and the fitting holes 37 of the second connector portion 33 are aligned in the Z direction. At this time, as shown in FIG. 12, each pair of second protruding pieces 25 of the second circuit board 21 and each pair of first protruding pieces 15 of the first circuit board 11 are positioned immediately below the corresponding fitting hole 37 of the second connector portion 33, i.e., on the −Z direction side of the fitting hole 37.

Since the second circuit board 21 is disposed such that the top and bottom surfaces thereof face in the opposite directions from those of the first circuit board 11 and thus the top surface 22A of the second substrate 22 of the second circuit board 21 is opposed to the top surface 12A of the first substrate 12 of the first circuit board 11, such a positional relationship is established that the first contact portions 16A and 16B formed on the first protruding pieces 15 of the first circuit board 11 are opposed to the second contact portions 26A and 26B formed on the second protruding pieces 25 of the second circuit board 21.

In this state, the second connector portion 33 is relatively moved in the −Z direction toward the first connector portion 32 such that the projections 35 of the first connector portion 32 sequentially pass through the openings 14 of the first circuit board 11 and the openings 24 of the second circuit board 21 and are then fitted into the fitting holes 37 of the second connector portion 33. Thus, the circuit board assembly is assembled.

In this process, the positioning protrusions 39 of the second connector portion 33 are separately inserted into the positioning cutouts 30 of the second circuit board 21, the positioning cutouts 20 of the first circuit board 11 and the positioning cutouts 38 of the first connector portion 32, whereby the circuit board assembly can be easily assembled without misalignment of the first connector portion 32, the first circuit board 11, the second circuit board 21 and the second connector portion 33 in any direction along an XY plane.

Since the reinforcement portions 19 are formed at the first substrate 12 of the first circuit board 11 and the reinforcement portions 29 are formed at the second substrate 22 of the second circuit board 21, the circuit board assembly can be assembled with good operability even with the first and second circuit boards 11 and 21 respectively having the first and second substrates 12 and 22 that are flexible. However, the first and second circuit boards 11 and 21 are not necessarily required to respectively have the reinforcement portions 19 and 29, and the circuit board assembly can still be assembled using the first and second circuit boards 11 and 21 without the reinforcement portions 19 and 29.

As described above, only by overlapping the first circuit board 11 and the second circuit board 21 on each other, passing the projections 35 of the first connector portion 32 through the openings 14 of the first circuit board 11 and the openings 24 of the second circuit board 21 and then fitting the projections 35 into the fitting holes 37 of the second connector portion 33, the circuit board assembly can be assembled, and thus the first circuit board 11 and the second circuit board 21 can be readily interconnected.

When the circuit board assembly is assembled, in the state where the first connector portion 32 is placed on a fixed surface of, for instance, a workbench, the second connector portion 33 may be pressed down from above toward the first connector portion 32 with the first circuit board 11 and the second circuit board 21 being sandwiched between the first and second connector portions 32 and 33. Alternatively, this may be turned upside down; specifically, in the state where the second connector portion 33 is placed on a fixed surface, the first connector portion 32 may be pressed down from above toward the second connector portion 33 with the second circuit board 21 and the first circuit board 11 being sandwiched therebetween.

Figure 13:
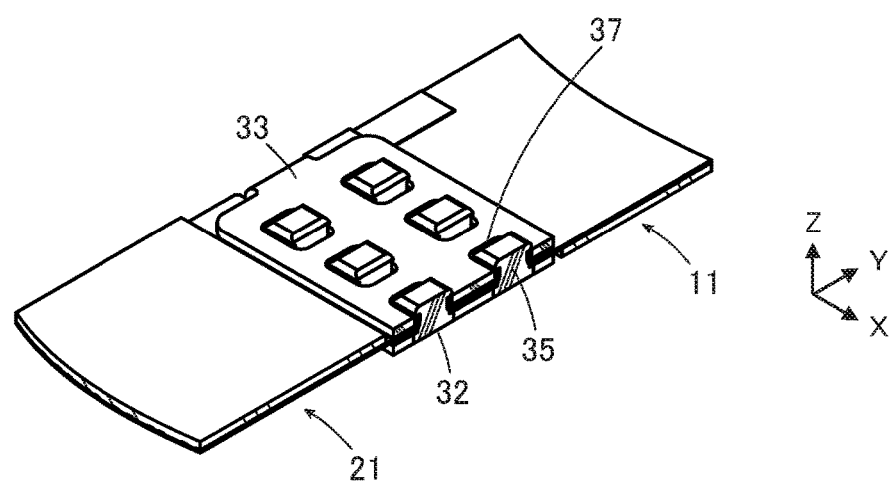
FIG. 13 is a cutaway perspective view showing the circuit board assembly according to Embodiment 1.
Figure 14:
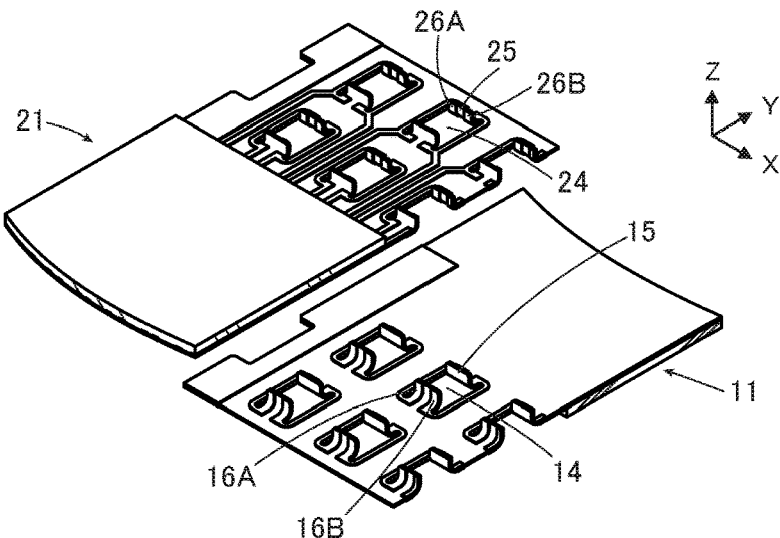
FIG. 14 is a perspective view showing the first contact portions of the first circuit board and the second contact portions of the second circuit board after assembling.

The circuit board assembly assembled as above is shown in FIG. 13. The projections 35 of the first connector portion 32 are correspondingly fitted into the fitting holes 37 of the second connector portion 33. When the projections 35 of the first connector portion 32 are fitted into the fitting holes 37 of the second connector portion 33 through the openings 14 of the first circuit board 11 and the openings 24 of the second circuit board 21, the pairs of first protruding pieces 15 projecting in the openings 14 of the first circuit board 11 and the pairs of second protruding pieces 25 projecting in the openings 24 of the second circuit board 21 are pushed in the +Z direction by the projections 35 and, as shown in FIG. 14, bent in the +Z direction in the fitting holes 37 of the second connector portion 33. With the bending of the first and second protruding pieces 15 and 25, the first contact portions 16A and 16B formed at the first protruding pieces 15 and the second contact portions 26A and 26B formed at the second protruding pieces 25 are also bent, accordingly.

Figure 15:
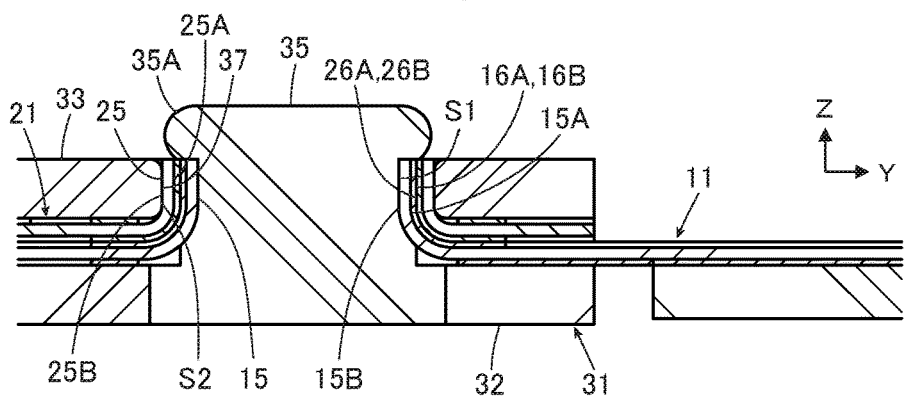
FIG. 15 is an enlarged partial cross-sectional view of the circuit board assembly according to Embodiment 1.

FIG. 15 shows the inside of the fitting hole 37 of the second connector portion 33 in which the projection 35 of the first connector portion 32 is fitted in cross section taken along a YZ plane. The pair of first contact portions 16A formed on the top surfaces 15A of the pair of first protruding pieces 15, bending in the +Z direction, of the first circuit board 11 and the pair of second contact portions 26A formed on the top surfaces 25A of the pair of second protruding pieces 25, bending in the +Z direction, of the second circuit board 21 are opposed to and overlapped on each other; the bottom surfaces 15B of the first protruding pieces 15 on which part of the first substrate 12 having insulation properties is exposed are in contact with the lateral surfaces S1 of the projection 35; and the bottom surfaces 25B of the second protruding pieces 25 on which part of the second substrate 22 having insulation properties is exposed are in contact with the inner surface S2 of the fitting hole 37. Since the projection 35 is made of insulating rubber or the like and thus has elasticity at least in the Y direction, the pair of first contact portions 16A of the first circuit board 11 and the pair of second contact portions 26A of the second circuit board 21 are elastically pressed against each other to establish their contact and thereby reliably electrically connected to each other.

Likewise, the pair of first contact portions 16B formed at the pair of first protruding pieces 15, bending in the +Z direction, of the first circuit board 11 and the pair of second contact portions 26B formed at the pair of second protruding pieces 25, bending in the +Z direction, of the second circuit board 21 are opposed to and overlapped on each other, elastically pressed against each other to establish their contact by the aid of the elastic projection 35 and thereby reliably electrically connected to each other.

Thus, the first circuit board 11 and the second circuit board 21 can be connected to each other by forming two electric path systems in each fitting hole 37 of the second connector portion 33. Accordingly, although the number of the projections 35 of the first connector portion 32 and that of the fitting holes 37 of the second connector portion 33 are each "16," it is possible to establish connections of electric signals of 32 systems in total.

At this time, the interconnected pair of first contact portions 16A of the first circuit board 11 separately come into contact with the interconnected pair of second contact portions 26A of the second circuit board 21, and likewise, the interconnected pair of first contact portions 16B of the first circuit board 11 separately come into contact with the interconnected pair of second contact portions 26B of the second circuit board 21, whereby the electrical connection between the first circuit board 11 and the second circuit board 21 improves in reliability.

When the circuit board assembly is assembled, the overhanging portions 35A of each projection 35 of the first connector portion 32 separately overhang in the +Y and −Y directions of the associated fitting hole 37 of the second connector portion 33 on the +Z direction side of the fitting hole 37, thereby preventing the first connector portion 32 from falling off the second connector portion 33. Accordingly, stable electrical connection can be established between the first circuit board 11 and the second circuit board 21.

The circuit board assembly has the structure in which each projection 35 of the first connector portion 32 is fitted into the corresponding fitting hole 37 of the second connector 33 whereby the first contact portions 16A and 16B of the first circuit board 11 and the second contact portions 26A and 26B of the second circuit board 21 are bent and come into contact with each other, correspondingly, between the relevant lateral surfaces S1 of the projection 35 and the inner surface S2 of the fitting hole 37; therefore, the circuit board assembly that is extremely thin in the Z direction can be obtained.

The projections 35 of the first connector portion 32 can be formed by shaping, for instance, insulating rubber by the aid of through-holes formed in the base plate 34. Alternatively, a member made of an insulating material such as insulating rubber may be pressed and fitted into through-holes of the base plate 34 to thereby form the projections 35.

Figure 16:
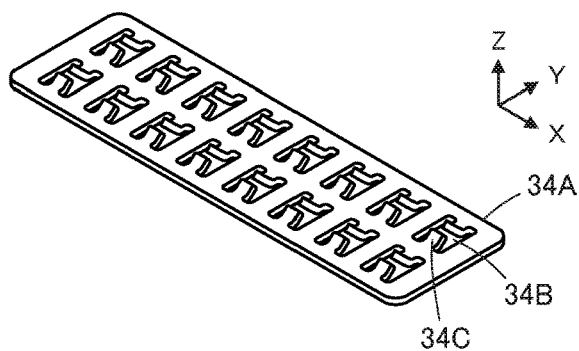
FIG. 16 is a perspective view showing a base plate of a first connector portion used in the circuit board assembly according to a modification of Embodiment 1.
Figure 17:
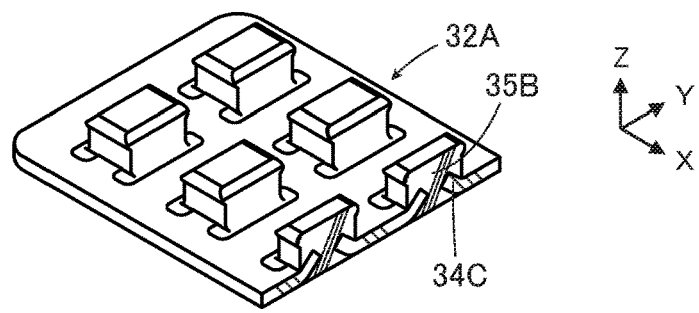
FIG. 17 is a cutaway perspective view showing the base plate of the first connector portion used in the circuit board assembly according to the modification of Embodiment 1.

Still alternatively, for example, with a base plate 34A having anchor portions 34C that project in the +Z direction separately from the +Y and −Y directional ends of a plurality of through-holes 34B as shown in FIG. 16, the anchor portions 34C may be utilized to shape projections 35B made of insulating rubber or the like and projecting in the +Z direction from the insides of the through-holes 34B as shown in FIG. 17, thereby forming a first connector portion 32A. Since the projections 35B are shaped to cover the anchor portions 34C, the retention strength of the projections 35B with respect to the base plate 34A is improved.

Embodiment 2

In Embodiment 1, the first circuit board 11 includes the reinforcement portions 19 made of conductive foil that are separately formed at the −X and +X directional ends of the first substrate 12, and the second circuit board 21 includes the reinforcement portions 29 made of conductive foil that are separately formed at the −X and +X directional ends of the second substrate 22; however, the invention is not limited thereto. In a circuit board assembly of Embodiment 2 shown in FIGS. 18 and 19, a first circuit board 41 includes a reinforcement plate 42 connected to the flexible first substrate 12 and having rigidity, while a second circuit board 51 includes a reinforcement plate 52 connected to the flexible second substrate 22 and having rigidity; those reinforcement plates 42 and 52 constitute reinforcement portions of the first circuit board 41 and the second circuit board 51, respectively.

Figure 18:
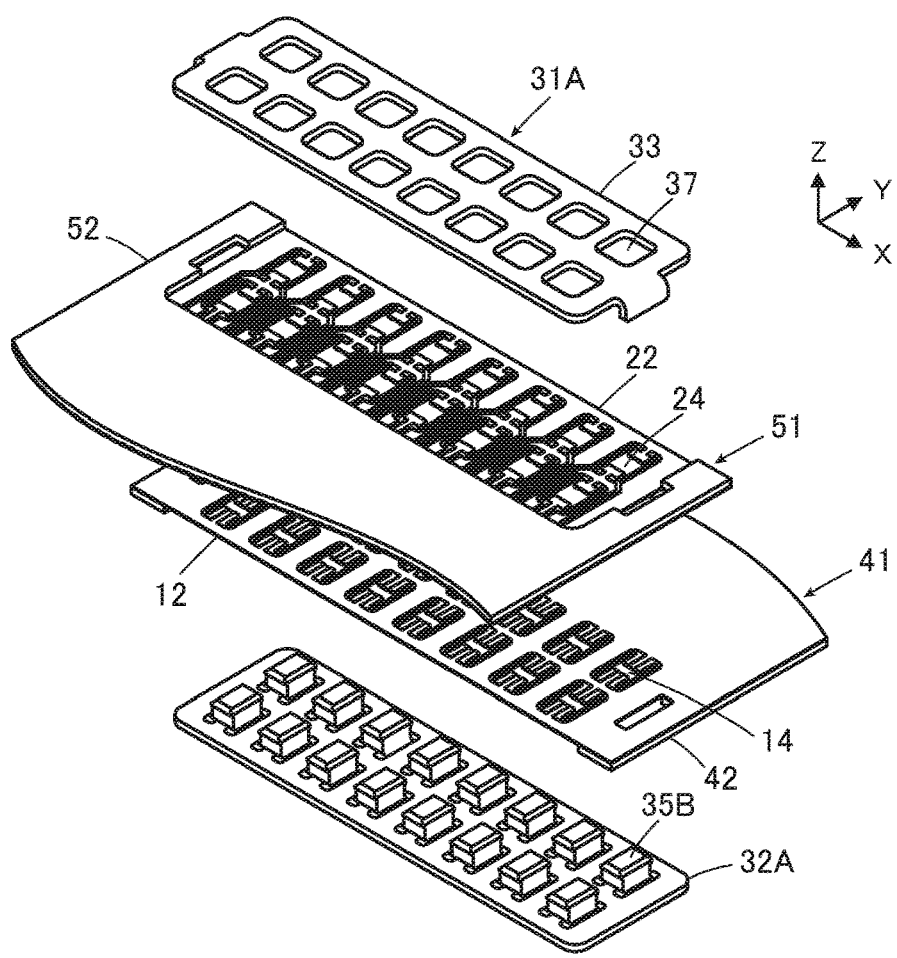
FIG. 18 is a perspective view of the first connector portion, a first circuit board, a second circuit board and the second connector portion of a circuit board assembly according to Embodiment 2 before assembling, as seen obliquely from above.
Figure 19:
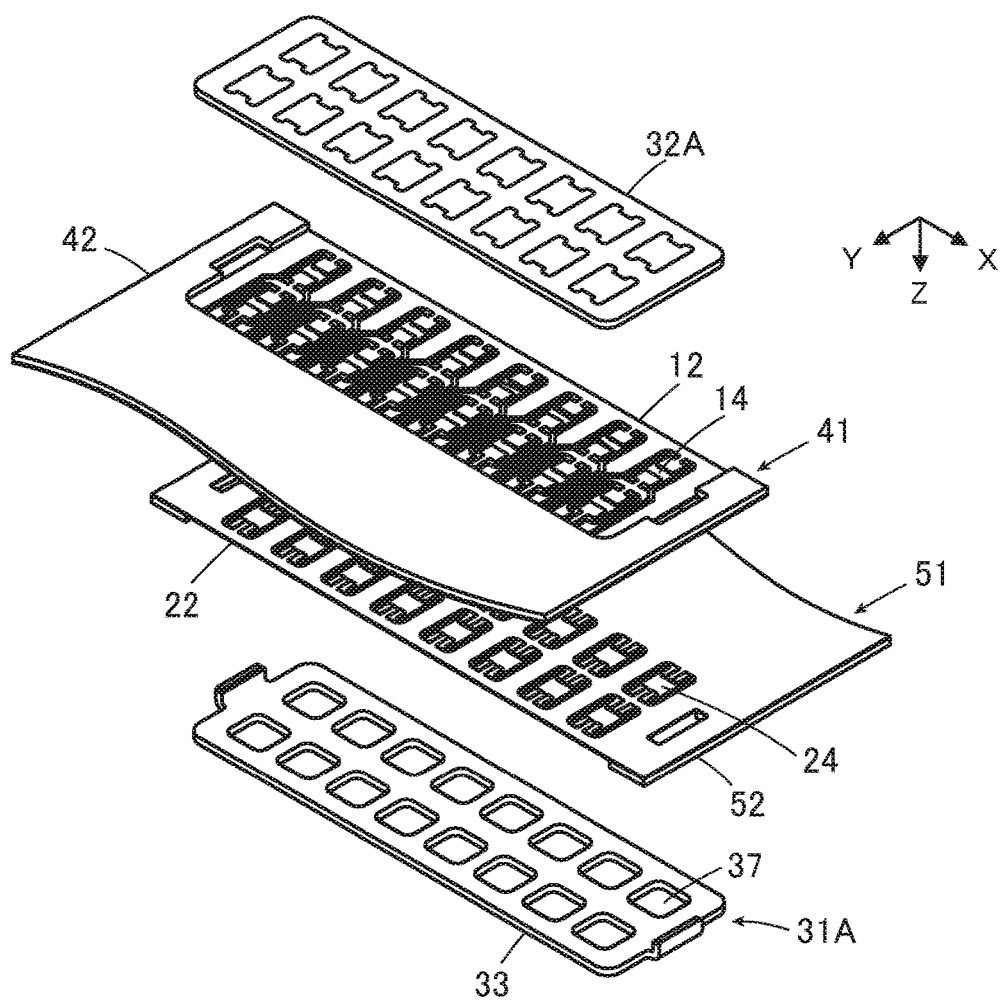
FIG. 19 is a perspective view of the first connector portion, the first circuit board, the second circuit board and the second connector portion of the circuit board assembly according to Embodiment 2 before assembling, as seen obliquely from below.

In FIGS. 18 and 19, a connector 31A for connecting the first and second circuit boards 41 and 51 is shown. While this connector 31A is composed of the first connector portion 32A shown in FIG. 17 and the second connector portion 33 shown in FIGS. 1 and 2, the connector 31A may be replaced by the connector 31 shown in FIGS. 1 and 2.

The circuit board assembly is assembled by relatively moving the second connector portion 33 in the −Z direction toward the first connector portion 32A such that the projections 35B of the first connector portion 32A sequentially pass through the openings 14 of the first circuit board 41 and the openings 24 of the second circuit board 51 and are then fitted into the fitting holes 37 of the second connector portion 33.

In this process, since the reinforcement plate 42 having rigidity is connected to the first substrate 12 of the first circuit board 41 and the reinforcement plate 52 having rigidity is connected to the second substrate 22 of the second circuit board 51, the circuit board assembly can be assembled with good operability even with the first and second circuit boards 41 and 51 respectively having the first and second substrates 12 and 22 that are flexible.

The reinforcement plate 42 of the first circuit board 41 and the reinforcement plate 52 of the second circuit board 51 do not overlap the connector 31A in the Z direction, and only the first substrate 12 of the first circuit board 41 and the second substrate 22 of the second circuit board 51 are present in the area where the first connector portion 32A and the second connector portion 33 are overlapped in the Z direction. Therefore, the reinforcement plates 42 and 52 can be used without hindering the reduction in thickness of the circuit board assembly in the Z direction.

Embodiment 3

Figure 20:
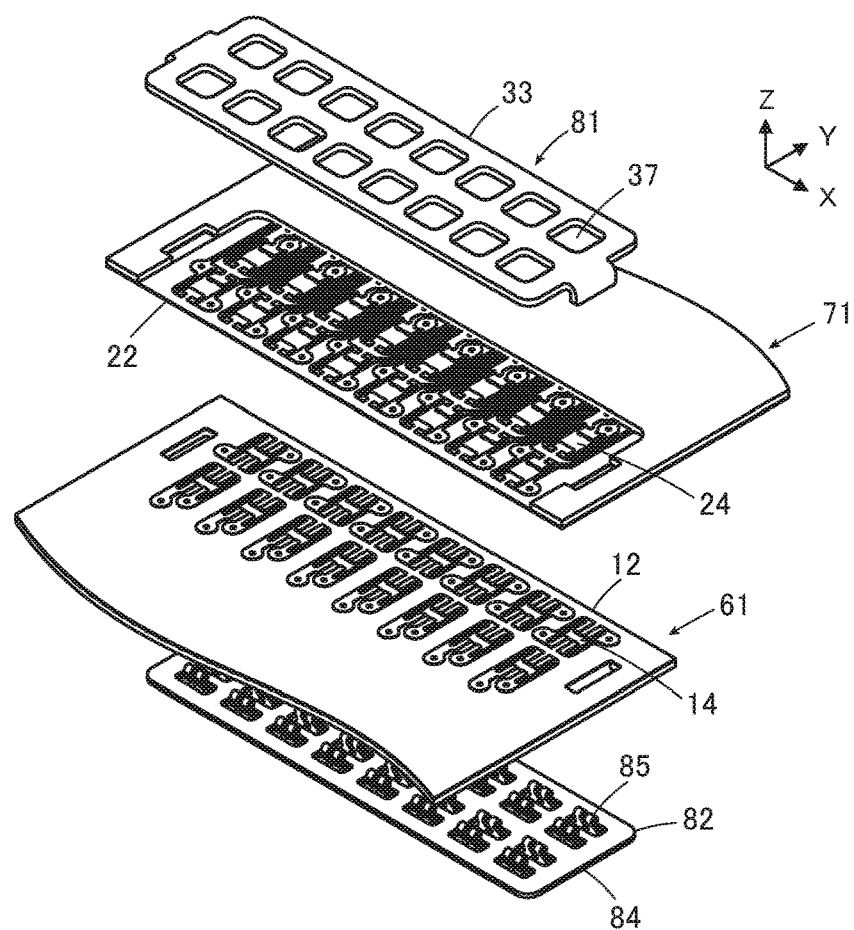
FIG. 20 is a perspective view of a first connector portion, a first circuit board, a second circuit board and the second connector portion of a circuit board assembly according to Embodiment 3 before assembling, as seen obliquely from above.

FIG. 20 shows a first circuit board 61, a second circuit board 71 and a connector 81 which are used in a circuit board assembly according to Embodiment 3, before assembling.

Figure 21:
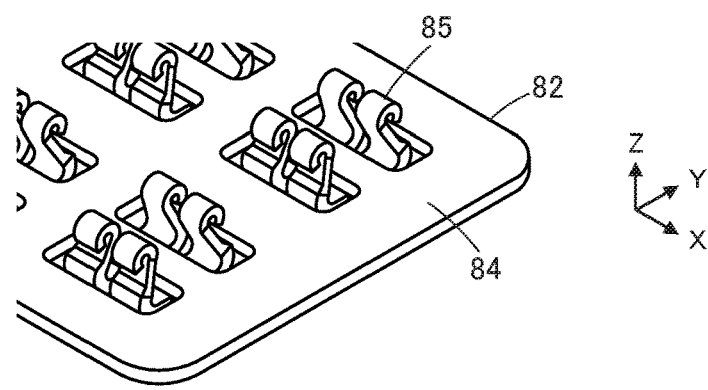
FIG. 21 is a perspective view showing projections of the first connector portion in Embodiment 3.
Figure 22:
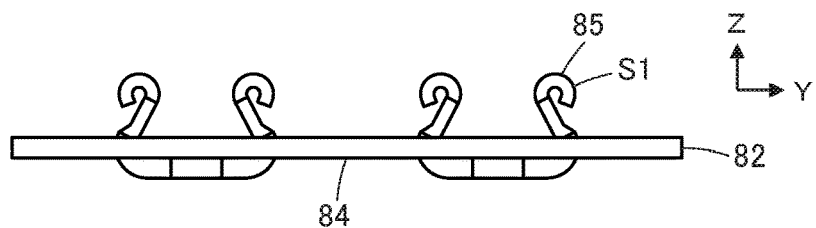
FIG. 22 is a side view showing the first connector portion in Embodiment 3.

The connector 81 is the same as the connector 31 used in Embodiment 1 except that the first connector portion 32 is replaced by a first connector portion 82, and the connector 81 is composed of the first connector portion 82 and the second connector portion 33 shown in FIG. 10. As shown in FIG. 21, the first connector portion 82 is configured such that a plurality of projections 85 composed of metal springs are disposed at a base plate 84 so as to be electrically insulated from each other. As shown in FIG. 22, each projection 85 projects in the +Z direction from a surface of the base plate 84, has a lateral surface S1 facing in the +Y or −Y direction, and has elasticity in the Y direction.

It is preferable for the base plate 84 to have insulation properties at least on its surface part in order to prevent the projections 85 from short-circuiting and because the base plate 84 has a chance to come into contact with the first circuit plate 61. For example, the projections 85 can be attached to a base plate 84 made of insulating resin or a base plate 84 formed by applying an insulating coating on a surface of a metal plate.

As shown in FIG. 20, the first circuit board 61 includes the flexible first substrate 12 having insulation properties and the H-shaped openings 14 penetrating the first substrate 12, as with the first circuit board 11 used in Embodiment 1. The second circuit board 71 includes the flexible second substrate 22 having insulation properties and the H-shaped openings 24 penetrating the second substrate 22, as with the second circuit board 21 used in Embodiment 1.

Figure 23:
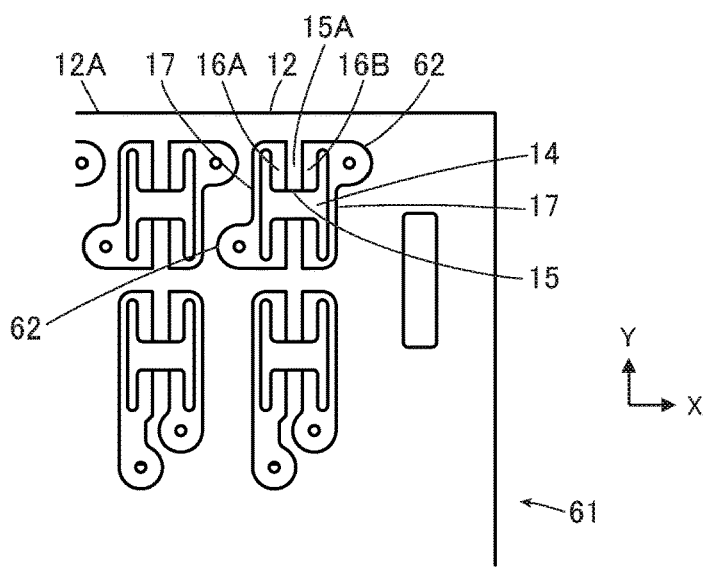
FIG. 23 is a view showing a top surface of the first circuit board in Embodiment 3.
Figure 24:
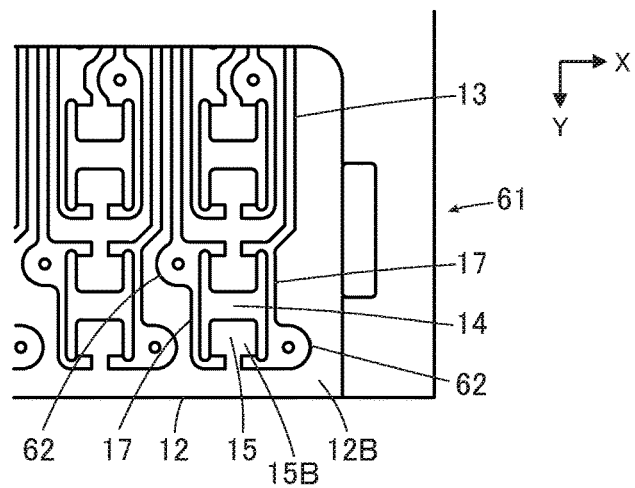
FIG. 24 is a view showing a bottom surface of the first circuit board in Embodiment 3.

The configurations of regions around the openings 14 on the top surface 12A and the bottom surface 12B of the first substrate 12 are shown in FIGS. 23 and 24. As with the first circuit board 11 used in Embodiment 1, the pair of first protruding pieces 15 formed of part of the flexible first substrate 12 are provided in each opening 14. As shown in FIG. 23, the pair of first contact portions 16A and the pair of first contact portions 16B are formed on the top surfaces 15A of the pair of first protruding pieces 15 facing in the +Z direction, and the pair of first contact portions 16A are electrically interconnected by the conductive portion 17 formed at the −X direction-side edge of the opening 14, while the pair of first contact portions 16B are electrically interconnected by the conductive portion 17 formed at the +X direction-side edge of the opening 14. The conductive portion 17 connecting the pair of first contact portions 16A and the conductive portion 17 connecting the pair of first contact portions 16B are each connected to a pad portion 62 projecting outwardly from the opening 14. Part of the first substrate 12 having insulation properties is exposed at the bottom surfaces 15B of the first protruding pieces 15 facing in the −Z direction.

As shown in FIG. 24, the bottom surface 12B of the first substrate 12 is provided with the first wiring portion 13 formed of a conductive layer, and the conductive portions 17 formed at the −X and +X direction-side edges of each opening 14 are separately connected to different wires of the first wiring portion 13. The conductive portion 17 on the −X direction side of the opening 14 and the conductive portion 17 on the +X direction side thereof are each connected to a pad portion 62 projecting outwardly from the opening 14.

For each opening 14, the pad portions 62 formed on the top surface 12A of the first substrate 12 are electrically connected to the corresponding pad portions 62 formed on the bottom surface 12B through corresponding vias that penetrate the first substrate 12 in the Z direction.

To be more specific, while, in the first circuit board 11, the conductive portion 17 on the top surface 12A of the first substrate 12 and the corresponding conductive portion 17 formed on the bottom surface 12B of the first substrate 12 are electrically interconnected via the conductive layer 18 formed on the relevant end surface (YZ plane) of the opening 14, in the first circuit board 61 of Embodiment 3, the conductive portion 17 on the top surface 12A of the first substrate 12 and the corresponding conductive portion 17 on the bottom surface 12B of the first substrate 12 are electrically interconnected through the relevant via.

Thus, the pair of first contact portions 16A and the pair of first contact portions 16B on the top surface 12A of the first substrate 12 are separately connected to different wires of the first wiring portion 13 on the bottom surface 12B of the first substrate 12 through the conductive portions 17 and the vias. In other words, the first contact portions 16A are electrically insulated from the first contact portions 16B in the first circuit board 61.

Figure 25:
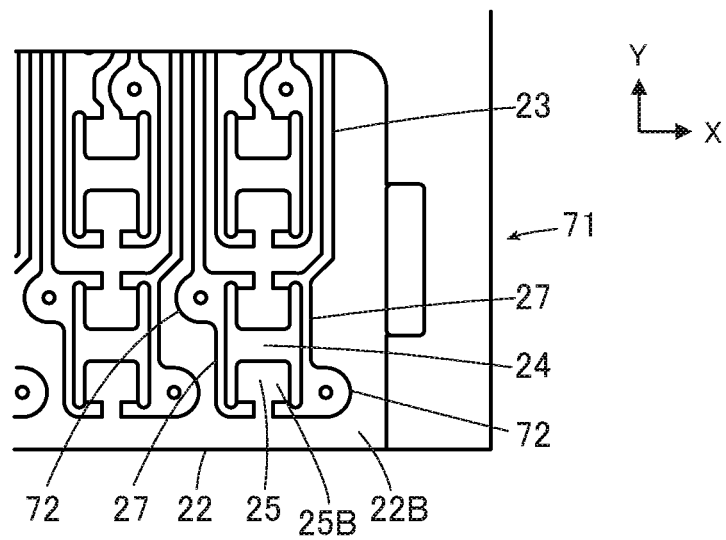
FIG. 25 is a view showing a top surface of the second circuit board in Embodiment 3.
Figure 26:
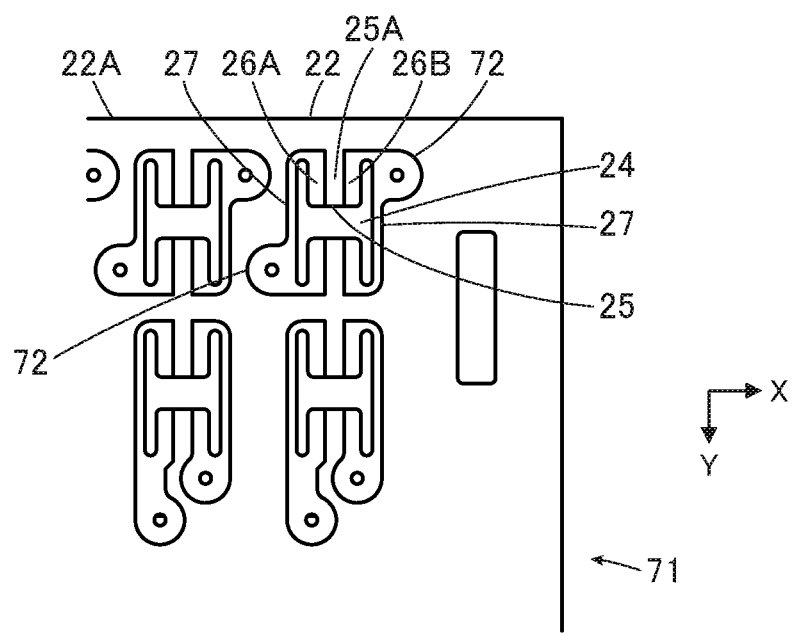
FIG. 26 is a view showing a bottom surface of the second circuit board in Embodiment 3.

The second circuit board 71 has the same structure as that of the first circuit board 61. The configurations of regions around the openings 24 on the top surface 22A and the bottom surface 22B of the second substrate 22 are shown in FIGS. 25 and 26. The pair of second protruding pieces 25 are formed in each opening 24, and the pair of second contact portions 26A and the pair of second contact portions 26B are formed on the top surfaces 25A of the pair of second protruding pieces 25 in the top surface 22A of the second substrate 22. The pair of second contact portions 26A are electrically interconnected by the corresponding conductive portion 27, and the same holds for the pair of second contact portions 26B. The conductive portion 27 connecting the pair of second contact portions 26A and the conductive portion 27 connecting the pair of second contact portions 26B are each connected to a pad portion 72 projecting outwardly from the opening 24. Part of the second substrate 22 having insulation properties is exposed at the bottom surfaces 25B of the second protruding pieces 25 facing in the +Z direction.

The bottom surface 22B of the second substrate 22 is provided with the second wiring portion 23 formed of a conductive layer, and the conductive portions 27 formed at the −X and +X direction-side edges of the opening 24 are separately connected to different wires of the second wiring portion 23. The conductive portion 27 on the −X direction side of the opening 24 and the conductive portion 27 on the +X direction side thereof are each connected to a pad portion 72 projecting outwardly from the opening 24.

For each opening 24, the pad portions 72 formed on the top surface 22A of the second substrate 22 are electrically connected to the corresponding pad portions 72 formed on the bottom surface 22B through corresponding vias that penetrate the second substrate 22 in the Z direction.

Thus, the pair of second contact portions 26A and the pair of second contact portions 26B on the top surface 22A of the second substrate 22 are separately connected to different wires of the second wiring portion 23 on the bottom surface 22B of the second substrate 22 through the conductive portions 27 and the vias. In other words, the second contact portions 26A are electrically insulated from the second contact portions 26B in the second circuit board 71.

Also in Embodiment 3 configured as above, the circuit board assembly is assembled by relatively moving the second connector portion 33 in the −Z direction toward the first connector portion 82 such that the projections 85 of the first connector portion 82 sequentially pass through the openings 14 of the first circuit board 61 and the openings 24 of the second circuit board 71 and are then fitted into the fitting holes 37 of the second connector portion 33.

In this process, when the projection 85 composed of metal springs and thus having elasticity in the Y direction is fitted into the corresponding fitting hole 37 of the second connector portion 33, the bottom surfaces 15B of the pair of first protruding pieces 15, on which part of the first substrate 12 having insulation properties is exposed, come into contact with the relevant lateral surfaces S1 of the projection 85, while the bottom surfaces 25B of the pair of second protruding pieces 25, on which part of the second substrate 22 having insulation properties is exposed, come into contact with the inner surface S2 of the fitting hole 37, and the pair of first contact portions 16A of the first circuit board 61 and the pair of second contact portions 26A of the second circuit board 71 are elastically pressed against each other to establish their contact and thereby electrically connected to each other. At the same time, the pair of first contact portions 16B of the first circuit board 61 and the pair of second contact portions 26B of the second circuit board 71 are elastically pressed against each other to establish their contact and thereby electrically connected to each other.

The projection 85 of the first connector portion 82 come into contact with the bottom surfaces 15B of the first protruding pieces 15 from the bottom surface 12B side of the first substrate 12 of the first circuit board 61 so that the first contact portions 16A and 16B of the first circuit board 61 and the second contact portions 26A and 26B of the second circuit board 71 are elastically pressed against each other correspondingly to establish their contact, and therefore, the projection 85 composed of metal springs does not come into direct contact with any of the first contact portions 16A and 16B and the second contact portions 26A and 26B. However, in order to prevent the projection 85 from short-circuiting to any of the conductive portions 17 and 27 at the edges of the openings 14 and 24, the surfaces of the projection 85 are preferably covered with an insulating material such as an insulating coating.

Embodiment 4

Figure 27:
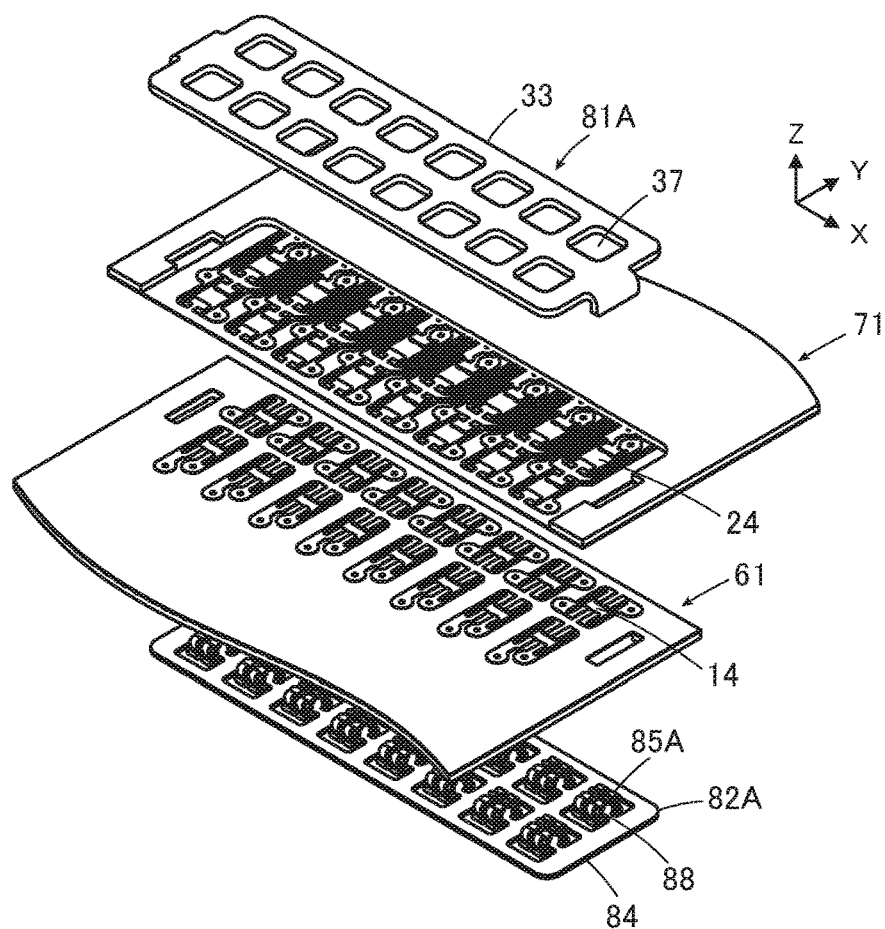
FIG. 27 is a perspective view of a first connector portion, a first circuit board, a second circuit board and the second connector portion of a circuit board assembly according to Embodiment 4 before assembling, as seen obliquely from above.

FIG. 27 shows the first circuit board 61, the second circuit board 71 and a connector 81A which are used in a circuit board assembly according to Embodiment 4, before assembling.

Figure 28:
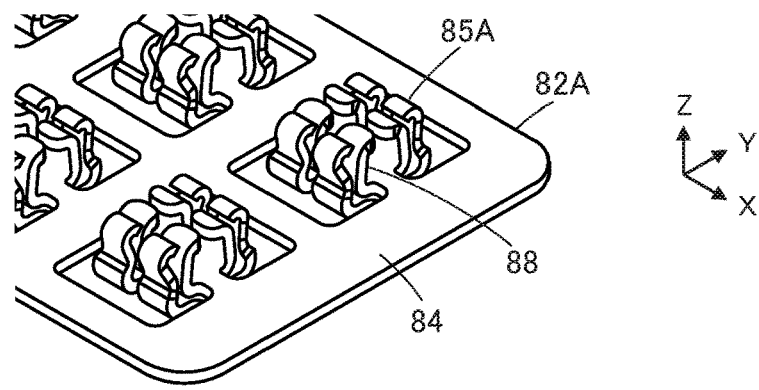
FIG. 28 is a perspective view showing projections of the first connector portion in Embodiment 4.
Figure 29:
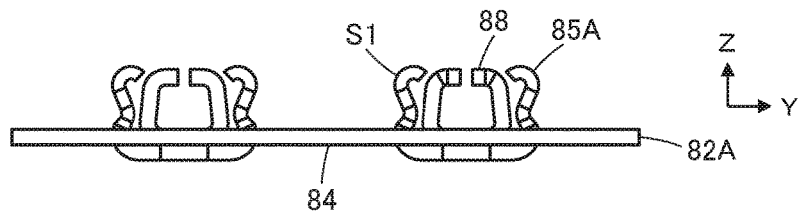
FIG. 29 is a side view showing the first connector portion in Embodiment 4.

The connector 81A is the same as the connector 81 used in Embodiment 3 except that the first connector portion 82 is replaced by a first connector portion 82A, and the connector 81A is composed of the first connector portion 82A and the second connector portion 33 shown in FIG. 10. As shown in FIGS. 28 and 29, the first connector portion 82A is configured such that a plurality of projections 85A composed of metal springs are disposed at the base plate 84 so as to be electrically insulated from each other and that a deformation restricting portion 88 is disposed inside each projection 85A. Each projection 85A projects in the +Z direction from the surface of the base plate 84, has lateral surfaces S1 facing in the +Y or −Y direction, and has elasticity in the Y direction.

The deformation restricting portion 88 is provided for preventing the projection 85A composed of metal springs from excessively deforming toward the inside of the fitting hole 37 of the second connector portion 33 when the projection 85A is fitted into the fitting hole 37. The deformation restricting portion 88 can be produced by, for instance, forming a cutout in the base plate 84 formed of a metal plate, and bending and raising part of the metal plate in the +Z direction.

The first circuit board 61 and the second circuit board 71 are the same as those used in Embodiment 3.

Figure 30:
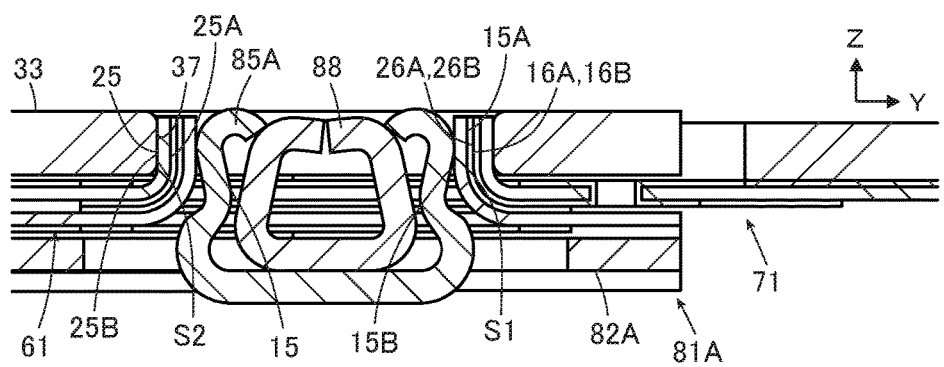
FIG. 30 is an enlarged partial cross-sectional view of the circuit board assembly according to Embodiment 4.

FIG. 30 shows the inside of the fitting hole 37 of the second connector portion 33 in which the projection 85A of the first connector portion 82A is fitted in cross section taken along a YZ plane. The pair of first contact portions 16A formed on the top surfaces 15A of the pair of first protruding pieces 15, bending in the +Z direction, of the first circuit board 61 and the pair of second contact portions 26A formed on the top surfaces 25A of the pair of second protruding pieces 25, bending in the +Z direction, of the second circuit board 71 are opposed to and overlapped on each other; the bottom surfaces 15B of the first protruding pieces 15 on which part of the first substrate 12 having insulation properties is exposed are in contact with the lateral surfaces S1 of the projection 85A; and the bottom surfaces 25B of the second protruding pieces 25 on which part of the second substrate 22 having insulation properties is exposed are in contact with the inner surface S2 of the fitting hole 37. Since the projection 85A is composed of metal springs and thus has elasticity in the Y direction, the pair of first contact portions 16A of the first circuit board 61 and the pair of second contact portions 26A of the second circuit board 71 are elastically pressed against each other to establish their contact and thereby reliably electrically connected to each other.

Likewise, the pair of first contact portions 16B formed at the pair of first protruding pieces 15, bending in the +Z direction, of the first circuit board 61 and the pair of second contact portions 26B formed at the pair of second protruding pieces 25, bending in the +Z direction, of the second circuit board 71 are opposed to and overlapped on each other, elastically pressed against each other to establish their contact by the aid of the elastic projections 85A and thereby reliably electrically connected to each other.

In this process, although the projection 85A of the first connector portion 82A deforms while bending toward the inside of the fitting hole 37 by the counteraction from the first protruding pieces 15 of the first circuit board 61 and the second protruding pieces 25 of the second circuit board 71, since the deformation restricting portion 88 is disposed inside each projection 85A fitted into the fitting hole 37, the projection 85A is prevented from excessively deforming, so that the first contact portions 16A and the second contact portions 26A are elastically pressed against each other and thereby reliably electrically connected to each other, and the same holds for the first contact portions 16B and the second contact portions 26B.

The deformation restricting portion 88 is also usable as a member that supplements an elastic force of the projection 85A.

Embodiment 5

In Embodiments 1 to 4 above, the projections 35, 35B, 85, 85A of the first connector portion 32, 32A, 82, 82A have elasticity at least in the Y direction, and the first contact portions 16A and 16B of the first circuit board 11, 41, 61 and the second contact portions 26A and 26B of the second circuit board 21, 51, 71 are elastically pressed against each other correspondingly to establish their contact; however, the invention is not limited thereto.

Figure 31:
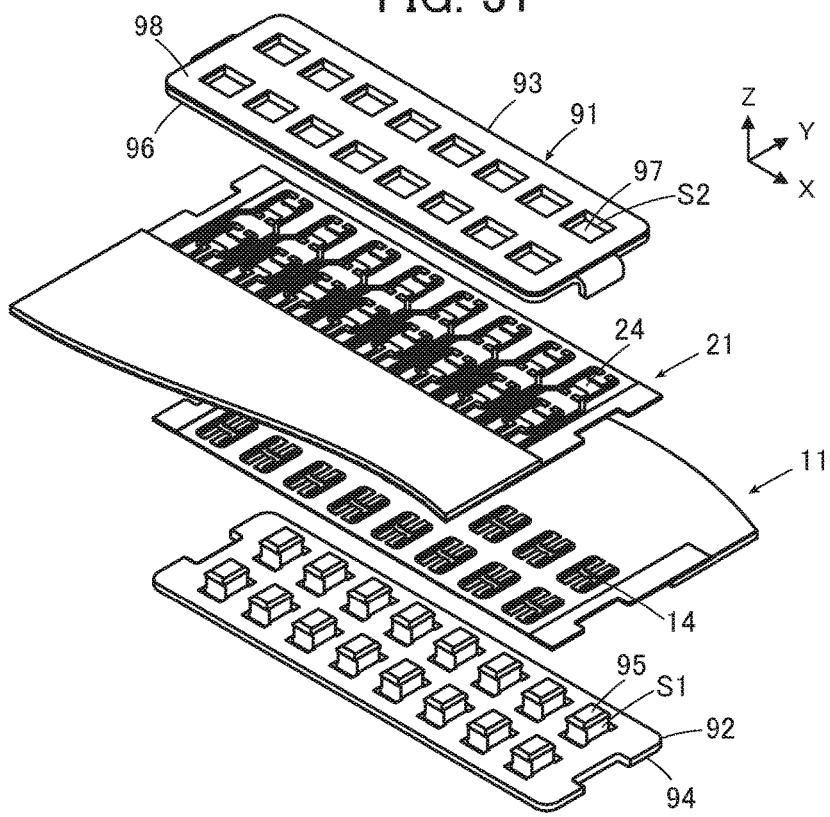
FIG. 31 is a perspective view of a first connector portion, a first circuit board, a second circuit board and the second connector portion of a circuit board assembly according to Embodiment 5 before assembling, as seen obliquely from above.
Figure 32:
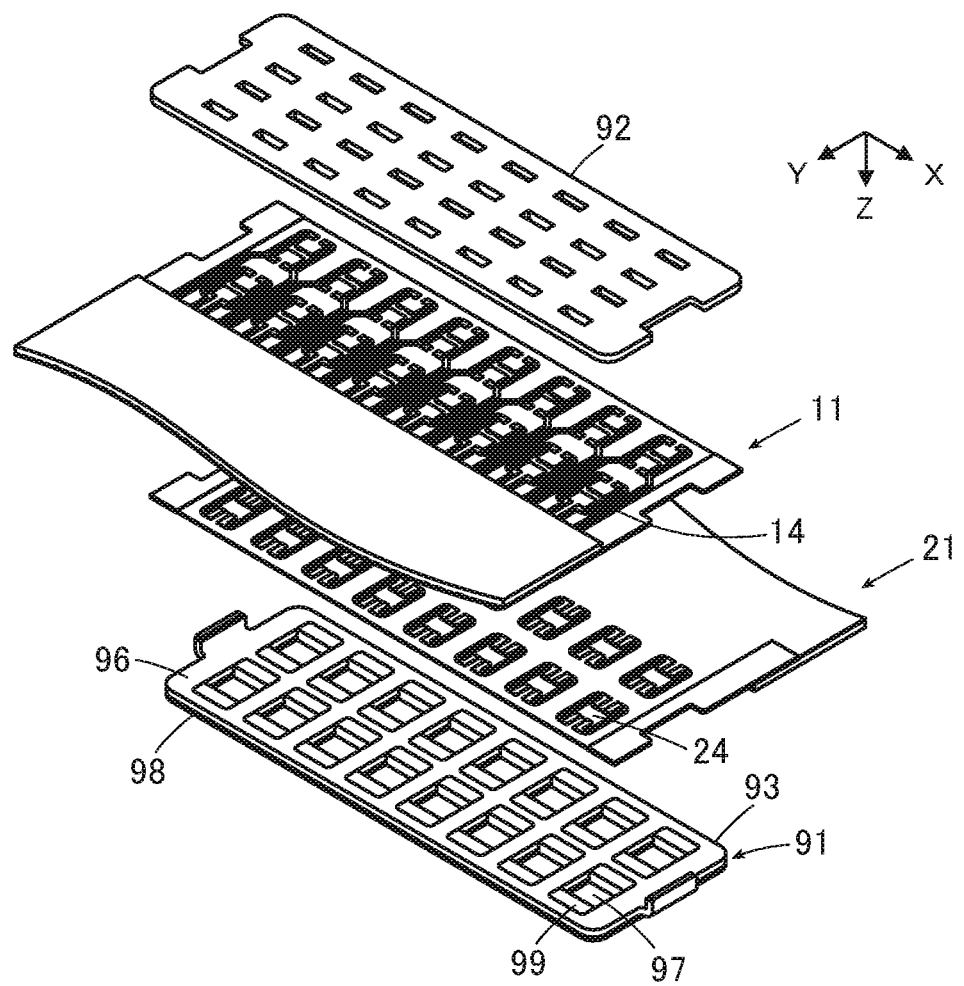
FIG. 32 is a perspective view of the first connector portion, the first circuit board, the second circuit board and the second connector portion of the circuit board assembly according to Embodiment 5 before assembling, as seen obliquely from below.
Figure 33:
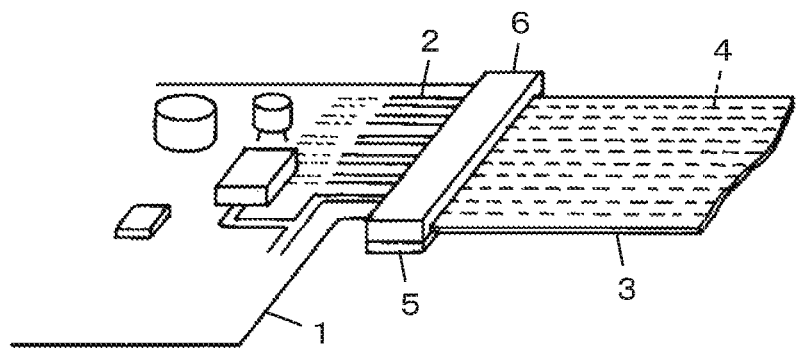
FIG. 33 is a perspective view showing a conventional connector connecting an FPC and a flat cable.
Figure 34:
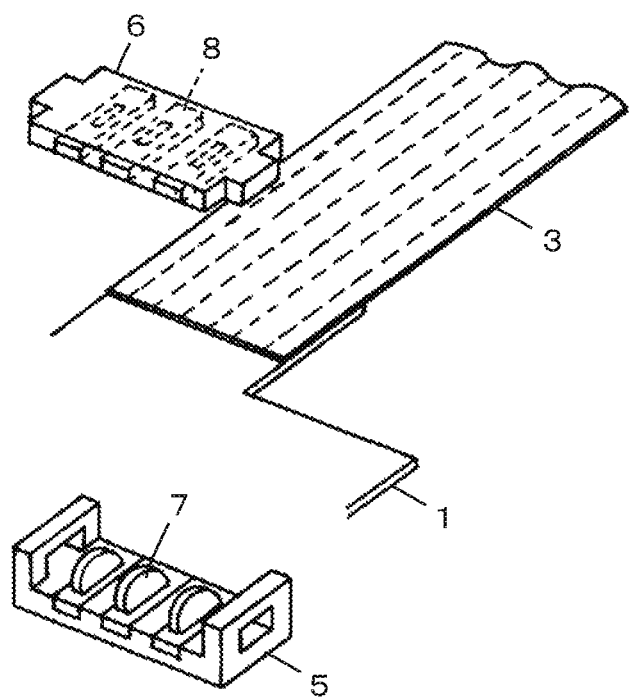
FIG. 34 is an exploded perspective view of the conventional connector connecting the FPC and the flat cable.

FIGS. 31 and 32 show the first circuit board 11, the second circuit board 21 and a connector 91 which are used in a circuit board assembly according to Embodiment 5, before assembling.

The connector 91 is composed of a first connector portion 92 and a second connector portion 93, and the first connector portion 92 includes a base plate 94 and a plurality of projections 95 in a shape of rectangular column that project on the surface of the base plate 94 facing in the +Z direction. The projections 95 need not have elasticity. For example, the base plate 94 and the projections 95 can be integrally formed from insulating resin.

On the other hand, the second connector portion 93 has the structure in which a fitting plate 96 having rigidity and having a plurality of through-holes formed therein is covered with a rubber layer 98 formed by rubber molding. The rubber layer 98 is disposed on the surface of the fitting plate 96 facing in the +Z direction and has filling portions 99 that fill the +Y and −Y directional ends of each through-hole of the fitting plate 96 as shown in FIG. 32. A substantially rectangular fitting hole 97 is formed between each pair of facing filling portions 99.

The fitting hole 97 is sandwiched in the Y direction by the filling portions 99 formed of the rubber layer 98 and therefore has elasticity in the Y direction owing to the material properties of the rubber layer 98.

Also in Embodiment 5, the circuit board assembly is assembled by relatively moving the second connector portion 93 in the −Z direction toward the first connector portion 92 such that the projections 95 of the first connector portion 92 sequentially pass through the openings 14 of the first circuit board 11 and the openings 24 of the second circuit board 21 and are then fitted into the fitting holes 97 of the second connector portion 93.

When the projection 95 of the first connector portion 92 is fitted into the fitting hole 97 of the second connector portion 93 having elasticity in the Y direction, the first contact portions 16A and 16B of the first circuit board 11 shown in FIG. 3 and the second contact portions 26A and 26B of the second circuit board 21 shown in FIG. 7 are elastically pressed against each other correspondingly to establish their contact and hence electrical connection in a space between the relevant lateral surfaces S1 of the projection 95 and the inner surface S2 of the fitting hole 97.

When the fitting plate 96 of the second connector portion 93 is formed of a metal plate, it is preferable to cover the surface of the fitting plate 96 facing in the −Z direction with an insulating coating in order to prevent a short-circuit to a conductive layer of the second circuit board 21 from occurring.

Alternatively, the fitting plate 96 may be formed of insulating resin.

The number of the openings 14 of the first circuit board 11, 41, 61, the number of the openings 24 of the second circuit board 21, 51, 71, the number of the projections 35, 35B, 85, 85A, 95 of the first connector portion 32, 32A, 82, 82A, 92, and the number of the fitting holes 37, 97 of the second connector portion 33, 93 in Embodiments 1 to 5 above each need not be "16" and may be one or more.

The fitting hole 37, 97 of the second connector portion 33, 93 has a substantially rectangular flat shape but may have a circular flat shape. However, since the pairs of first contact portions 16A and 16B of the first circuit board 11, 41, 61 are brought into contact with the pairs of second contact portions 26A and 26B of the second circuit board 21, 51, 71 in a single fitting hole 37, 97, it is preferable for the fitting hole 37, 97 to have a substantially rectangular flat shape.

While, in Embodiments 1 to 5 above, the two electric path systems, that is, one including the first contact portions 16A and the second contact portions 26A and the other including the first contact portions 16B and the second contact portions 26B, are formed in a single fitting hole 37, 97, one or three or more electric path systems may be formed in a single fitting hole 37, 97 in the same manner.

While, in Embodiment 1, the projection 35 of the first connector portion 32 has a larger projection amount from the surface of the base plate 34 than the sum of the plate thicknesses of the first circuit board 11, the second circuit board 21 and the fitting plate 36 of the second connector portion 33, the invention is not limited thereto. The projection amount of the projection 35 from the surface of the base plate 34 may be smaller than or equal to the sum of the plate thicknesses of the first circuit board 11, the second circuit board 21 and the fitting plate 36 of the second connector portion 33 as long as the first contact portions 16A and 16B of the first circuit board 11 and the second contact portions 26A and 26B of the second circuit board 21 are elastically pressed against each other correspondingly to establish their contact in a space between the relevant lateral surfaces S1 of the projection 35 and the inner surface S2 of the fitting hole 37. In this case, the first connector portion 32 cannot be prevented from falling off the second connector portion 33 by the presence of the overhanging portions 35A of the projection 35 that overhang on the +Z direction side of the fitting hole 37 of the second connector portion 33; however, other measures may be taken such as, for instance, provision of a general-purpose fixing mechanism that fixes the first connector portion 32 and the second connector portion 33 to each other.

Likewise, the projection 35B, 85, 85A of the first connector portion 32A, 82, 82A in Embodiments 2 to 4 may be configured to have a larger projection amount from the surface of the base plate 34, 84 than the sum of the plate thicknesses of the first circuit board 11, 41, 61, the second circuit board 21, 51, 71 and the fitting plate 36 of the second connector portion 33 so as to prevent the first connector portion 32A, 82, 82A from falling off the second connector portion 33. However, the projection amount of the projection 35B, 85, 85A may be set smaller than or equal to the sum of the plate thicknesses of the first circuit board 11, 41, 61, the second circuit board 21, 51, 71 and the fitting plate 36 of the second connector portion 33.

Also in Embodiment 5, the projection 95 of the first connector portion 92 from the surface of the base plate 94 may be configured to have a larger projection amount than the sum of the plate thicknesses of the first circuit board 11, the second circuit board 21, and the fitting plate 96 and the rubber layer 98 of the second connector portion 93 so as to prevent the first connector portion 92 from falling off the second connector portion 93. However, the projection amount of the projection 95 may be set smaller than or equal to the sum of the plate thicknesses of the first circuit board 11, the second circuit board 21, and the fitting plate 96 and the rubber layer 98 of the second connector portion 93.

While the opening 14 of the first circuit board 11, 41, 61 and the opening 24 of the second circuit board 21, 51, 71 in Embodiments 1 to 5 have an H shape, the shapes of the openings 14 and 24 are not limited thereto. For instance, U-shaped openings may be formed so that a single first contact portion 16A, 16B comes into contact with a single second contact portion 26A, 26B in a single fitting hole 37, 97. The opening 14, 24 preferably takes on the shape that enables to obtain a large contact area between the first contact portion 16A, 16B and the second contact portion 26A, 26B in order to improve the reliability of electrical connection.

In Embodiments 1 to 5, the first circuit board 11, 41, 61 is constituted of a circuit board including the flexible first substrate 12 having insulation properties, and the second circuit board 21, 51, 71 is constituted of a circuit board including the flexible second substrate 22 having insulation properties; however, the invention is not limited thereto, and one or both of the first and second circuit boards may be each constituted of a printed circuit board or a rigid flexible printed circuit board as long as each has a bendable first contact portion and a bendable second contact portion.

In Embodiments 3 and 4, each of the projections 85 and 85A composed of metal springs has two projecting pieces situated adjacent to each other in the X direction and projecting in the +Z direction from the surface of the base plate 84 as shown in FIGS. 21 and 28; however, the invention is not limited thereto, and each of the projections 85 and 85A may have a single projecting piece undivided in the X direction or three or more projecting pieces.

While, in Embodiments 3 and 4, each of the projections 85 and 85A is composed of metal springs, rubber may further be molded on the metal springs to utilize elastic forces of both the metal springs and the rubber.

What is claimed is:

1. A connector for connecting a first circuit board having a first contact portion that is bendable and a second circuit board having a second contact portion that is bendable, the connector comprising:
   a first connector portion in which one or more projections project from a surface of a base plate; and
   a second connector portion formed of a fitting plate in which one or more fitting holes corresponding to the one or more projections are formed,
   wherein the first contact portion is formed on a surface of a first protruding piece protruding from the first circuit board and having insulation properties,
   wherein the second contact portion is formed on a surface of a second protruding piece protruding from the second circuit board and having insulation properties,
   wherein at least either the one or more projections or the one or more fitting holes have elasticity, and
   wherein when the one or more projections of the first connector portion are fitted in the one or more fitting holes of the second connector portion as catching the first contact portion of the first circuit board and the second contact portion of the second circuit board with the first and second contact portions facing and being overlapped on each other, one of a bottom surface of the first protruding piece and a bottom surface of the second protruding piece is in contact with the lateral surface of the one or more projections, while the other of the bottom surface of the first protruding piece and the bottom surface of the second protruding piece is in contact with the inner surface of the one or more fitting holes, the first contact portion of the first circuit board and the second contact portion of the second circuit board are elastically pressed against each other and contacted to each other to establish electrical connection therebetween in a space between a lateral surface of the one or more projections and an inner surface of the one or more fitting holes.

2. The connector according to claim 1,
   wherein a projection amount of the one or more projections from the surface of the base plate is larger than a sum of plate thicknesses of the first circuit board, the second circuit board and the fitting plate.

3. The connector according to claim 1, further comprising a positioning mechanism positioning the first connector portion, the first circuit board, the second circuit board and the second connector portion with respect to each other.

4. The connector according to claim 1,
   wherein at least a surface portion of the one or more projections is made of a conductive material.

5. The connector according to claim 4,
   wherein the first connector portion includes a plurality of the projections that are disposed on the surface of the base plate while being electrically insulated from each other.

6. The connector according to claim 4,
   wherein the one or more projections is made of a metal spring.

7. The connector according to claim 6,
   wherein the first connector portion has a deformation restricting portion that prevents the one or more projections from excessively deforming.

8. The connector according to claim 1,
   wherein at least a surface portion of the one or more projections is made of an insulating material.

9. The connector according to claim 8,
   wherein the insulating material is insulating rubber.

10. The connector according to claim 8,
    wherein the first connector portion includes a plurality of the projections disposed on the surface of the base plate.

11. A circuit board assembly, comprising:
    the first circuit board;
    the second circuit board; and
    the connector according to claim 1,
    wherein the one or more projections of the first connector portion are fitted in the one or more fitting holes of the second connector portion as catching the first contact portion of the first circuit board and the second contact portion of the second circuit board with the first and second contact portions facing and being overlapped on each other, and the first contact portion of the first circuit board and the second contact portion of the second circuit board are elastically pressed against each other and contacted to each other to establish electrical connection therebetween in the space between the lateral surface of the one or more projections and the inner surface of the one or more fitting holes.

12. The circuit board assembly according to claim 11, wherein a plurality of the first contact portions of the first circuit board and a plurality of the second contact portions of the second circuit board, which are overlapped correspondingly, are fitted in the one fitting hole of the second connector portion together with the one projection to be electrically connected to each other.

13. The circuit board assembly according to claim 11, wherein each of the first circuit board and the second circuit board is formed of a substrate that is flexible, has insulation properties and has a conductive layer formed thereon, the first contact portion being connected to the conductive layer of the first circuit board, the second contact portion being connected to the conductive layer of the second circuit board.

14. The circuit board assembly according to claim 13, wherein each of the first circuit board and the second circuit board has a reinforcement portion.

15. The circuit board assembly according to claim 14, wherein the reinforcement portion is made of conductive foil formed on a surface of the substrate.

16. The circuit board assembly according to claim 14, wherein the reinforcement portion is formed of a reinforcement plate having rigidity and connected to the substrate.

* * * * *